United States Patent
Ohki

Patent Number: 5,412,789
Date of Patent: May 2, 1995

[54] MULTI-PORT MEMORY WITH SERIALLY CONNECTED OUTPUT ELEMENTS

[75] Inventor: Mitsuharu Ohki, Tokyo, Japan

[73] Assignee: Sony Corporation, Tokyo, Japan

[21] Appl. No.: 874,742

[22] Filed: Apr. 27, 1992

[30] Foreign Application Priority Data

Apr. 30, 1991 [JP] Japan .................. 3-126690

[51] Int. Cl.6 ............................................. G06F 13/00
[52] U.S. Cl. ..................... 395/425; 364/DIG. 1; 364/244.8; 364/965.9
[58] Field of Search ............. 395/425, 189.04, 200, 395/230.05

[56] References Cited

U.S. PATENT DOCUMENTS

| | | | |
|---|---|---|---|
| 4,541,075 | 9/1985 | Dill et al. | 365/189.04 |
| 4,633,441 | 12/1986 | Ishimoto | 365/230.05 |
| 4,821,226 | 4/1989 | Christopher et al. | 395/425 |
| 4,987,559 | 1/1991 | Miyauchi et al. | 365/189.04 |
| 5,065,369 | 11/1991 | Toda | 365/230.05 |
| 5,170,157 | 12/1992 | Ishii | 345/28 |
| 5,206,831 | 4/1993 | Wakamatsu | 365/200 |

*Primary Examiner*—Reba I. Elmore
*Attorney, Agent, or Firm*—Mark C. Pickering; Limbach & Limbach

[57] ABSTRACT

Address bits AU1 to AU4 designating rows of a memory 1 at random are successively given thereto. Respective Q lines of each row of the memory 1 are connected in series to register groups SR-R1 to SR-R4. An address bit of a row designated with AU1 to AU4 is stored in each register group. Respective data of the register groups SR-R1 to SR-R4 is supplied to output ports SO1 to SO4 in series by selectors SL1 to SL4. Instead of the register groups SR-R1 to SR-R4 and the selectors SL1 to SL14, shift registers can be used.

9 Claims, 14 Drawing Sheets

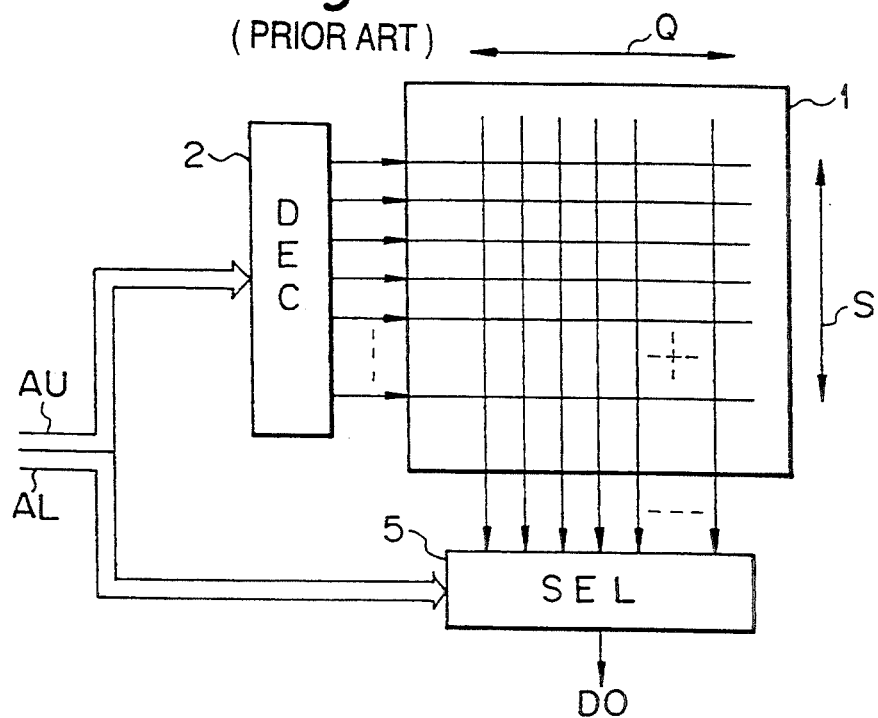
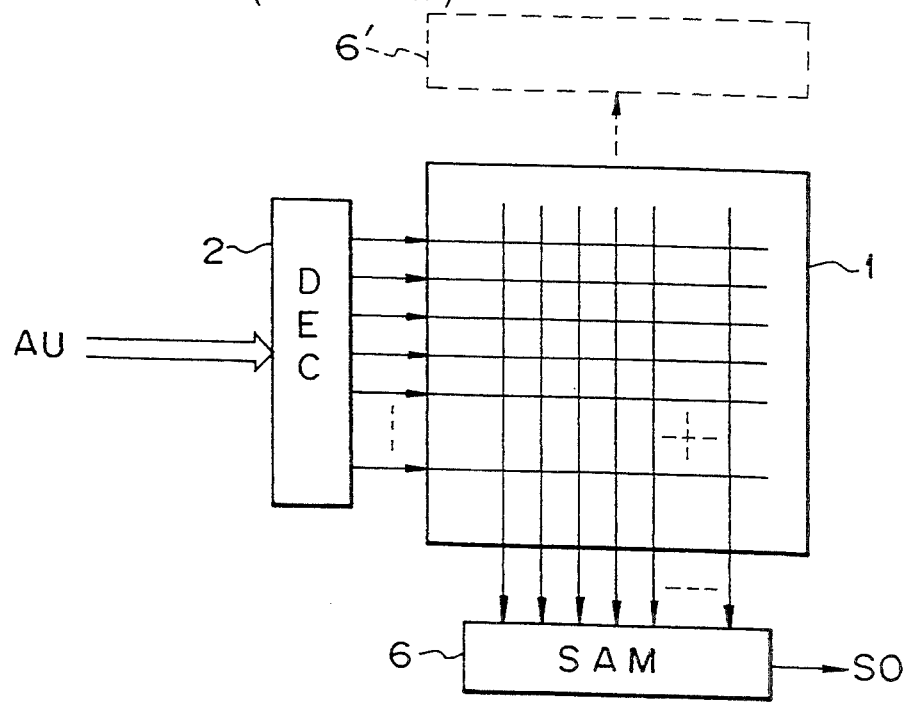

MULTI-PORT MEMORY WITH SERIALLY CONNECTED OUTPUT ELEMENTS

BACKGROUND OF THE INVENTION

1. Field of the Invention

The present invention relates to a multi-port memory for use in image processing.

2. Description of the Prior Art

With reference to FIG. 1, a conventional semiconductor memory is described. In a memory of Q columns×S rows (memory array) 1, a row thereof is selected with an output signal of a decoder 2 in accordance with a high order bit AU of an address. By connecting a connection line of a row of the memory 1 to a selector 5 and by controlling the selector 5 with a low order bit AL of the address, read data DO is obtained from the selector 5. The high order bit AU is represented with log N bit. The low order bit AL is represented with log M bit. To simplify the description, FIG. 1 only represents a read mode of the memory array 1.

Recently, a memory suitable for a video signal in accordance with a raster scanning sequence has been proposed. This memory is referred to as a dual-port memory or a video memory. As shown in FIG. 2, this memory is provided with a port for a serial output data SO. In other words, a decoder 2 only outputs a row address. A shift register 6 referred to as SAM serially outputs read data of one row. Thus, serial output data SO is obtained. Normally, row data is loaded to the shift register 6 in parallel at a speed intrinsic to this port.

The port for the output data DO shown in FIG. 1 is referred to as a random access port. The port of the output data SO shown in FIG. 2 is referred to as a serial output port. A memory which is provided with both the ports is referred to as a dual-port memory or a video memory. The dual-port memory is useful in an image processing circuit. However, the image processing circuit may require a plurality of serial output ports. Conventionally, another shift register 6' is disposed at the position represented with a dotted line of FIG. 2 so as to provide two serial output ports. However, so far, it has been difficult to provide four or more serial output ports.

To provide a plurality of serial output ports, as shown in FIG. 3, shift registers SR1, SR2, SR3, and SR4 are connected to the column connection lines of a memory 1 in parallel. These shift registers SR1, SR2, SR3, and SR4 are provided with serial output ports SO1, SO2, SO3, and SO4, respectively. The shift registers SR1, SR2, SR3, and SR4 receive shift clocks SCK1, SCK2, SCK3, and SCK4, respectively. A control circuit 4 supplies parallel load signals LD1, LD2, LD3, and LD4 to the respective shift registers. In addition, high order bits AU1, AU2, AU3, and AU4 in accordance with the respective ports are supplied to a selector 3. With a control signal from a control circuit 4, one of the high order bits is selected.

For example, when the high order bit AU1 is selected by the selector 3, the load signal LD1 is supplied to the shift register SR1. Data of the row accessed with the high order bit AU1 is loaded to the shift register SR1 in parallel. The data of the shift register SR1 is output as serial data SO1 with the shift clock SCK1.

In the construction shown in FIG. 3, the column connection lines should drive the four shift registers SR1, SR2, SR3, and SR4. As the number of shift registers to be driven increases, the load being applied becomes large. Thus, to provide a driver with a large capacity (a buffer circuit), the driver DR1 should have a large area as shown in FIG. 4A. In addition, as shown in FIGS. 4B and 4C, with one driver with an intermediate capacity DR1 and four conventional drivers DR3, the driving capacity can be improved. However, in all of the alternative constructions shown in FIGS. 4A to 4C, the circuit scale becomes large. Thus, it is difficult to provide the drivers in the memory 1. Thus far, a multi-port memory with a large number of serial output ports has not been accomplished.

Moreover, there is another disclosed circuit construction where each port has two stages, a signal being loaded into a first register, an output signal of the first register being input to a second register, and an output signal of the second register being output. This circuit construction is disclosed by the applicant of the present invention as Japanese Patent Application Serial No. HEI 2-173327. In this case, since each port has two stages, the circuit scale disadvantageously becomes large.

OBJECT AND SUMMARY OF THE INVENTION

Therefore, an object of the present invention is to provide a multi-port memory having a plurality of serial output ports in a smaller circuit scale than those conventionally available.

According to an aspect of the present invention, there is provided a multi-port memory comprising:

- P stages of buffer groups, connected in series to Q connection lines of columns of a semiconductor memory, for driving Q data pieces, where P and Q are integers greater than one;
- P register groups for receiving Q data pieces from Q outputs of the P buffer groups, respectively, and for storing the Q data pieces;
- T selector units for receiving data pieces in parallel from the P register groups, storing the received data pieces, and outputting the data pieces in series from T serial output ports at respective output terminals of the T selector units, where T is an integer greater than one; and
- a controller connected to the semiconductor memory, the buffer groups, the register groups, and the selector units for controlling the flow of data pieces through the Q connection lines, controlling the flow of data through the P register groups, and controlling the output of data from the T serial output ports.

According to a second aspect of the invention, there is provided a multi-port memory comprising:

- P stages of buffer groups, connected in series to Q connection lines of columns of a semiconductor memory, for driving Q data pieces, where P and Q are integers greater than one;
- P shift registers for receiving Q data pieces from Q outputs of the P buffer groups respectively and for storing said Q data pieces;
- P serial output ports disposed at respective output terminals of the shift registers; and
- a controller connected to the semiconductor memory, the buffer groups, and the shift registers for selectively designating respective address bits, for loading the shift registers, and for selecting shift operations of the shift registers.

According to a third aspect of the invention, there is provided a multi-port memory comprising:

P stages of register groups, connected in series to Q connection lines of columns of a semiconductor memory, for storing Q data pieces, where P and Q are integers greater than one;

T selector units for receiving data pieces in parallel from the P register groups, storing the received data pieces, and outputting the data pieces in series from T serial output ports disposed at respective output terminals of the T selector units, where T is an integer greater than one; and control means connected to the semiconductor memory, the register groups, and the selector means for controlling the flow of data pieces through the Q connection lines, controlling the flow of data through the P register groups, and controlling the output of data from the T serial output ports.

According to a fourth aspect of the invention, there is provided a multi-port memory comprising:

P shift registers, connected in series to Q connection lines of columns of a semiconductor memory, for receiving Q outputs of said connection lines in parallel and for storing Q data pieces, where P and Q are integers greater than one;

P serial output ports disposed at respective output terminals of the shift registers; and a controller connected to the semiconductor memory and the shift registers for controlling the flow of data pieces through the Q connection lines and the P shift registers.

In accordance with the first and second aspects of the invention, only the driving of the buffer group of the first stage is necessary. In accordance with the third aspect of the invention, only the driving of the register group SR-R4 of the first stage is necessary. In accordance with the fourth aspect of the invention, only the shift register of the first stage is necessary. Thus, since the output load of the memory does not become large, a multi-port memory in the nearly same circuit scale as a conventional video RAM can be accomplished.

The above, and other, objects, features and advantage of the present invention will become readily apparent from the following detailed description thereof which is to be read in connection with the accompanying drawings.

BRIEF DESCRIPTION OF THE DRAWINGS

FIG. 1 is a block diagram describing a conventional semiconductor memory;

FIG. 2 is a block diagram describing a conventional dual-port memory;

DETAILED DESCRIPTION OF THE PREFERRED EMBODIMENTS

Figure 5:
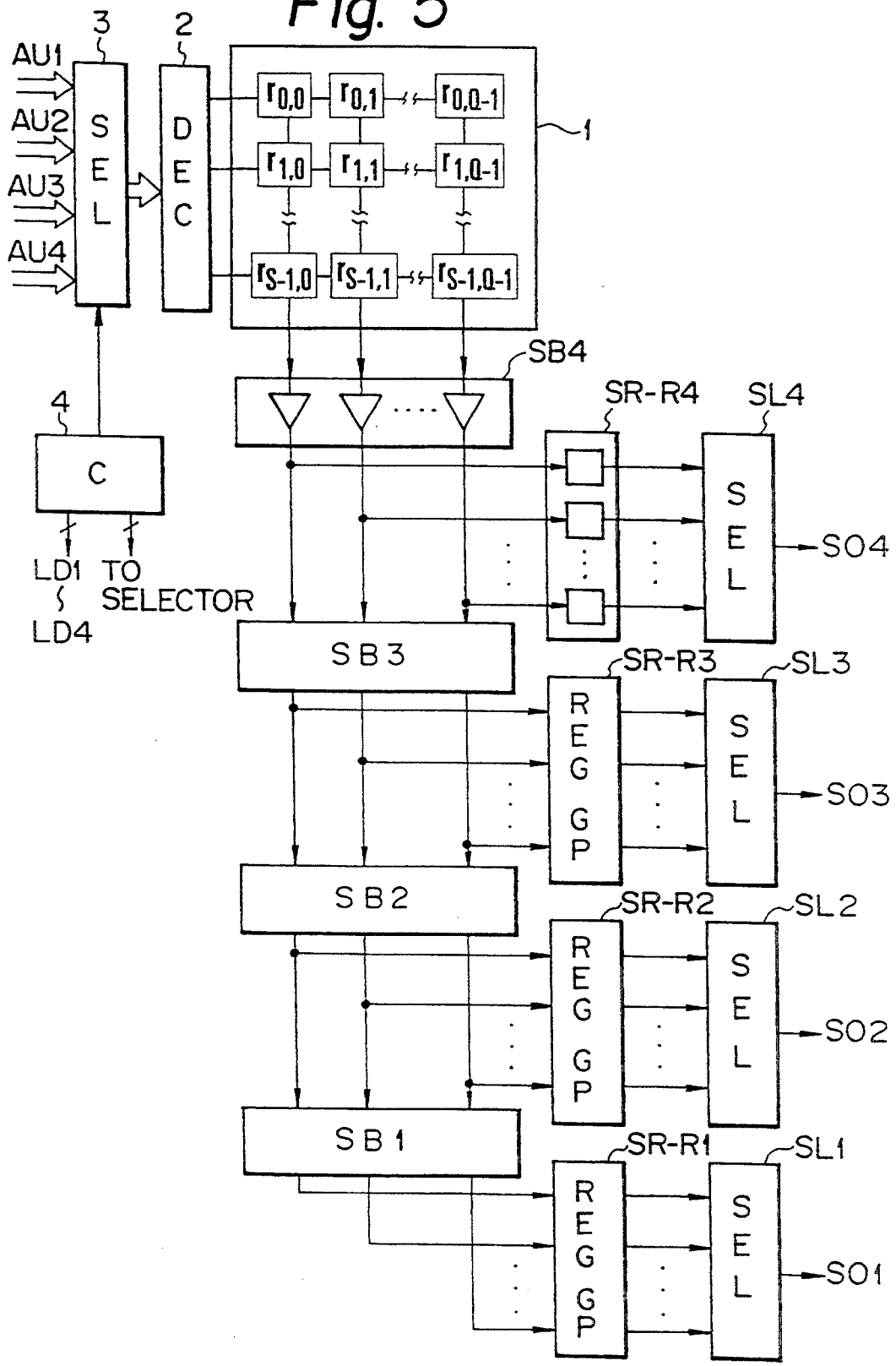
FIG. 5 is a block diagram showing an overall construction in accordance with a first embodiment of the present invention.

With reference to the accompanying drawings, embodiments according to the present invention are described. FIG. 5 is a block diagram showing a construction in accordance with a first embodiment of the present invention. In FIG. 5, reference numeral 1 is a semiconductor memory constructed of memory elements $r_{ij}$ of (Q columns $\times$ S rows). Reference numeral 2 is an address decoder. Reference numeral 3 is an address selector. The address selector 3 receives high order bits AU1 to AU4 of an address. A row is selected with an output signal of the address decoder 2 in accordance with the high order bits of the address being selected.

Q column connection lines of the memory 1 are connected to four buffer groups which are referred to as first buffer group to fourth buffer group SB1 to SB4 in series. Between the buffer groups SB4 and SB3, a fourth register group SR-R4 storing Q data pieces is disposed. Likewise, register groups SR-R3, SR-R2, and SR-R1 which store respective Q data pieces, are respectively driven by the buffer groups SB3, SB2, and SB1. Q-input, one-output selectors, which are referred to as first to fourth selectors SL1 to SL4, are provided. The first to fourth selectors SL1 to SL4 each receive as inputs respective Q data pieces from the register groups SR-R1 to SR-R4 and output one data additional buffer groups can be connected in the positions indicated by the dotted lines piece at first to fourth serial output ports SO1 to SO4, respectively.

Figure 3:
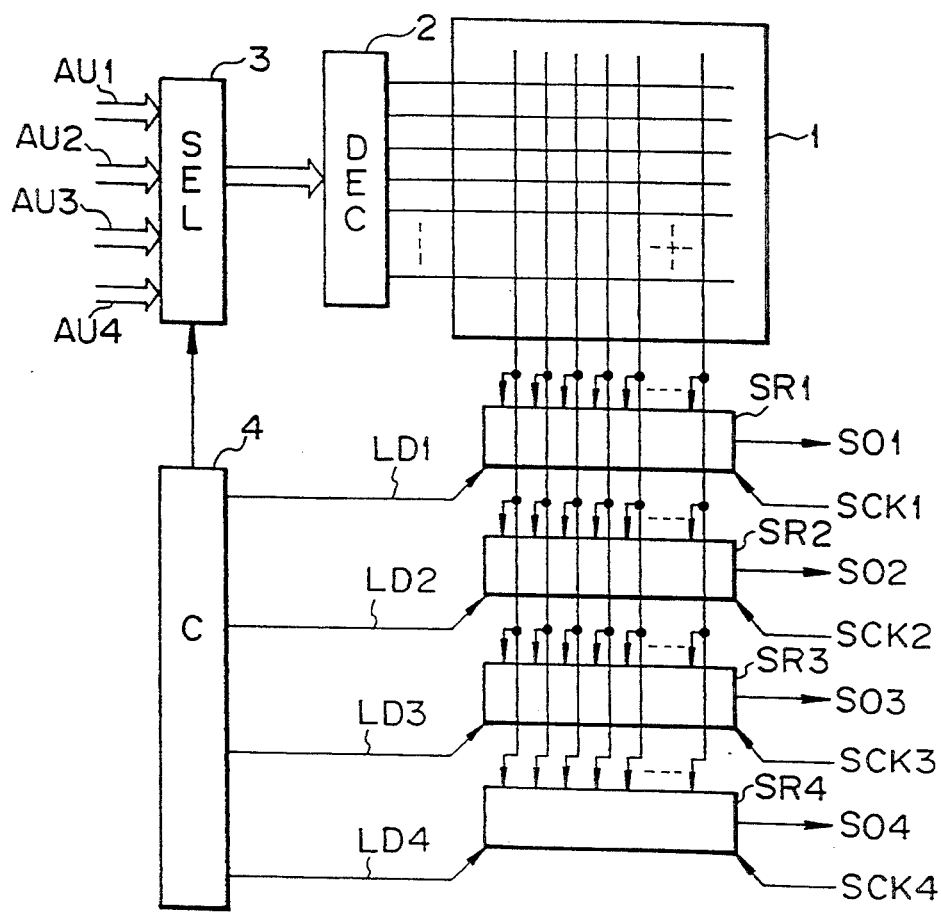
FIG. 3 is a block diagram describing a conventional multi-port memory.
Figure 4A:
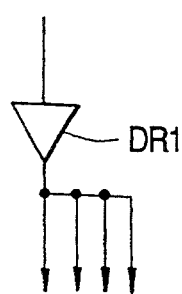
FIGS. 4A-4C are block diagrams describing a problem which arises in the conventional multi-port memory.
Figure 4B:
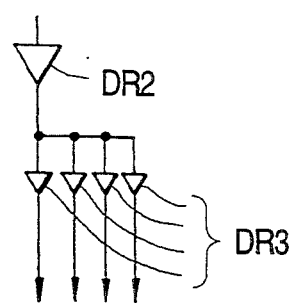
Figure 4C:
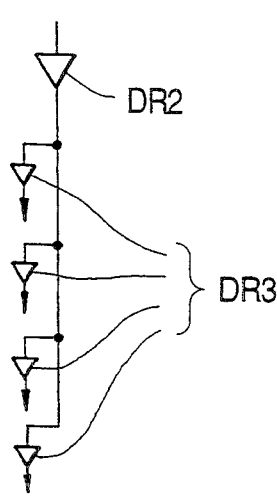
Figure 6:
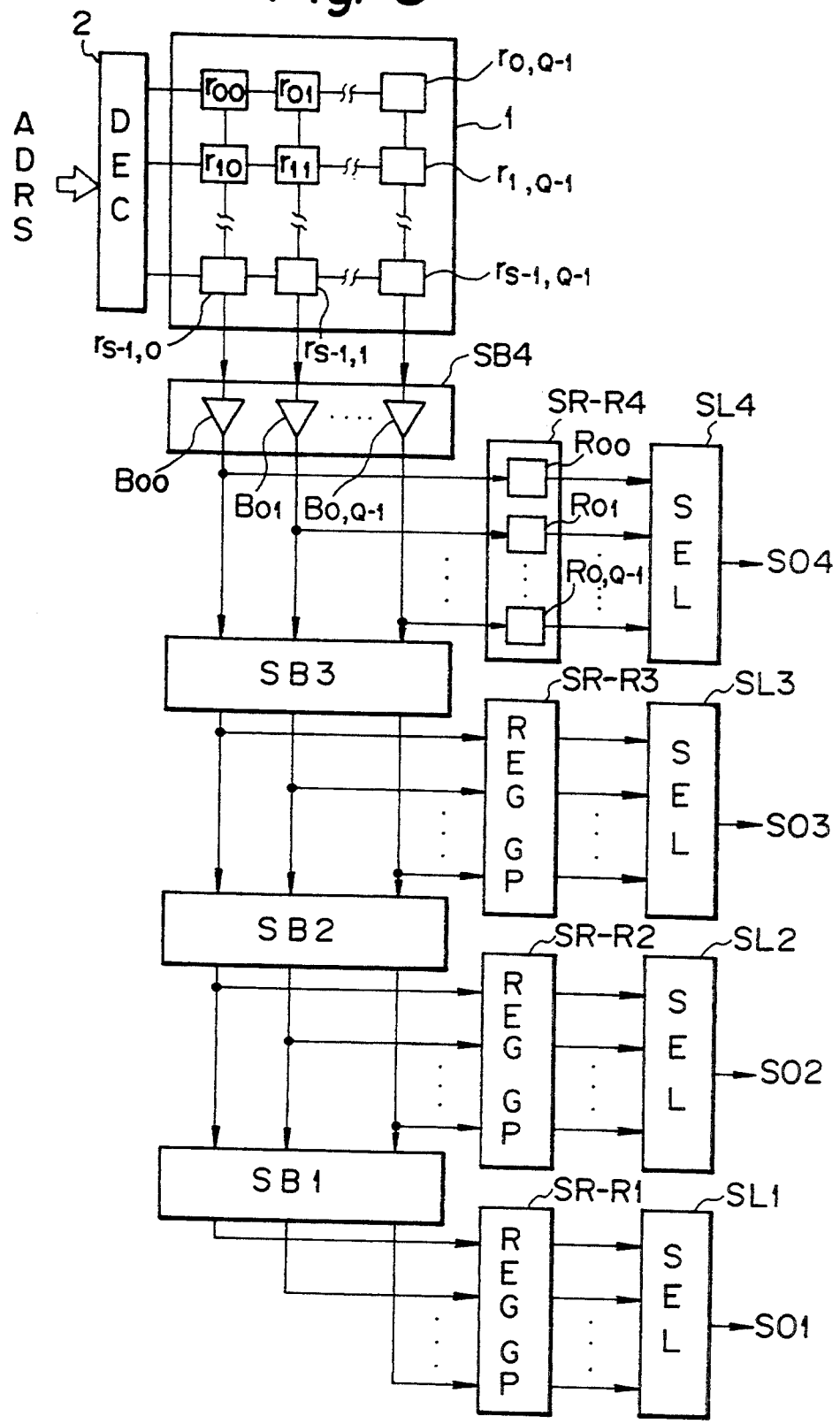
FIG. 6 is a block diagram showing a construction of principal portions in accordance with the first embodiment of the present invention.

As shown in FIG. 6, which illustrates principal portions of FIG. 5, the buffer group SB4 comprises Q buffers $B_{00}$ to $B_{0, Q-1}$. Likewise, other buffer groups SB3, SB2, and SB1 are respectively constricted Q buffers. The register group SR-R4 is constructed of Q registers $R_{00}$ to $R_{0, Q-1}$. Likewise, the other register groups SR-R3, SR-R2, and SR-R1 are respectively constructed Q registers. In this embodiment, although the buffer groups SB1 to SB4 are required, since each buffer group drives a subsequent register group and a subsequent selector, the buffers for use in this embodiment do not require a large drive capacity as described with reference to FIG. 4.

In FIG. 5, reference numeral 4 is a control circuit. The control circuit 4 controls the selection of the address selector 3. In addition, the control circuit generates load signals LD1 to LD4 for loading data to the respective register groups SR-R1 to SR-R4. Moreover, the control circuit 4 controls the selection of the selectors SL1 to SL4. Under control of the control circuit 4, the following operations are performed in succession.

First, data to be output from the serial output port SO1 in series is loaded to the first register group SR-R1. Thereafter, data to be output from the serial output port SO2 is loaded to the register group SR-R2. Thereafter, data to be output from the serial output port SO3 is loaded to the register group SR-R3. Last, data to be output from the serial output port SO4 is loaded to the register group SR-R4. To read these four data pieces from the memory 1, the address selector 3 selects the high order address bits AU1 to AU4 one after the other. These four row data pieces which are read from the memory 1 are random accessed.

Thereafter, through the Q-input, one-output selectors SL1 to SL4, data pieces of the respective register groups SR-R1 to SR-R4 are output to the respective serial output ports SO1 to SO4. Clocks (not shown in the figure) necessary for the serial outputs are supplied to the respective register groups.

Figure 7:
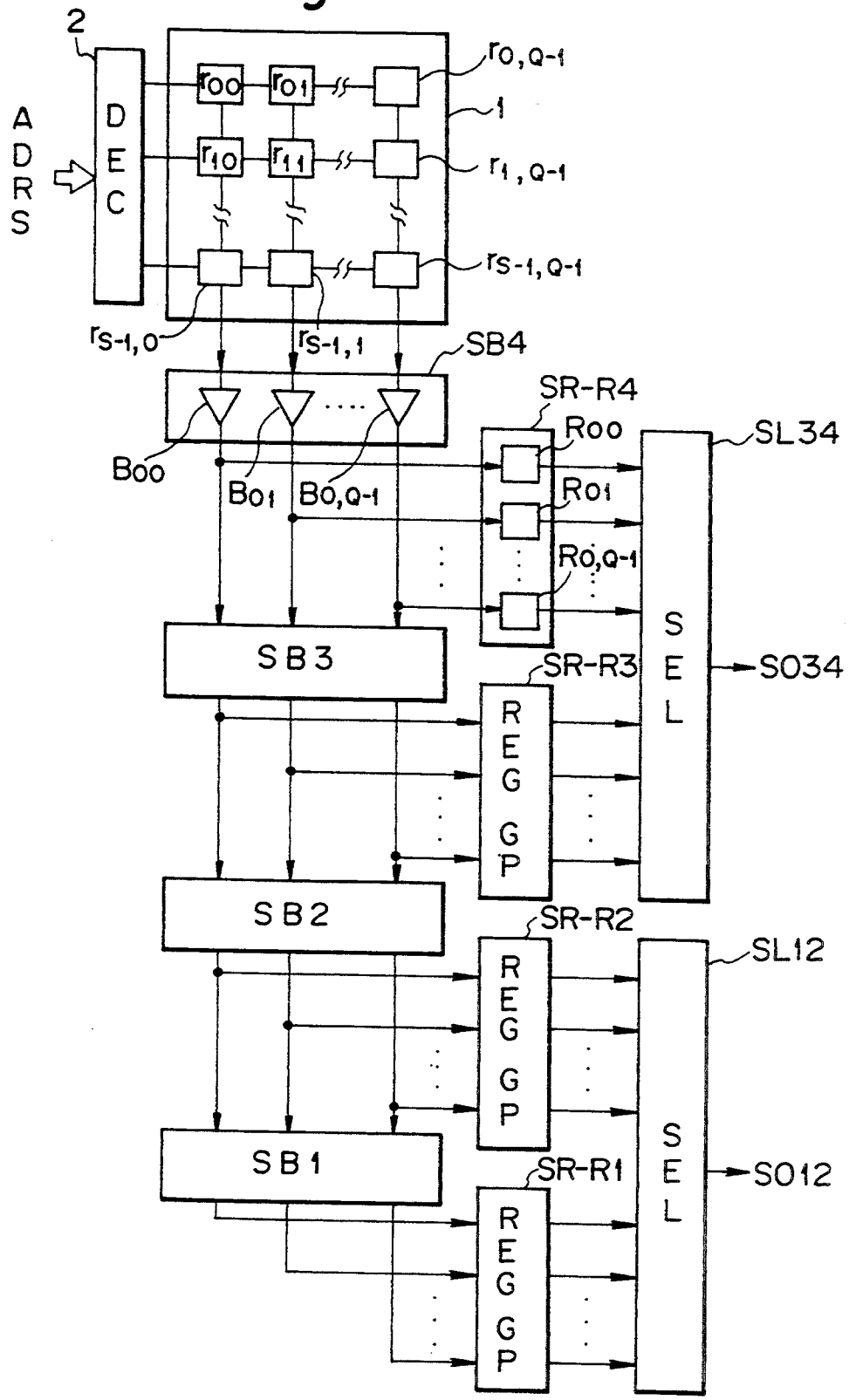
FIG. 7 is a block diagram showing a construction of principal portions in accordance with a second embodiment of the present invention.

FIG. 7 is a schematic diagram showing principal portions in accordance with a second embodiment of the present invention. Like the above described first embodiment, in the second embodiment, buffer groups SB-1 to SB-4 and register groups SR-R1 to SR-R4 are provided. The buffer groups SB-1 to SB-4 drive respective Q data pieces which are read from Q connection lines of a memory 1. The register groups SR-R1 to SR-R4 each respectively store Q data pieces. By the register groups SR-R4 and SR-R3, a total of 2Q output data pieces are supplied to a 2Q-input, one-output selector SL34. Likewise, by the register groups SR-R2 and SR-R1, a total of 2Q output data pieces are supplied to a 2Q-input, one-output selector SL12. Thus, two serial output ports SO12 and SO34 are provided as shown.

Like the first embodiment, in the second embodiment, four rows of data pieces being read from the memory 1 in succession are loaded to the register groups SR-R1 to SR-R4. The 2Q data pieces stored in the register groups SR-R2 and SR-R1 can be output in series from the serial output port SO12 through the selector SL12. A similar operation applies to the serial output port SO34.

The second embodiment is used when data for one line of a video signal is constructed of 2Q pieces. In this construction, the first half Q data pieces and the second half Q data pieces total of 2Q data pieces have been stored in each odd row and each even row of the memory 1, respectively. The first half of the one line of data and the second half thereof are loaded to the register group SR-R2 and the register group SR-R1, respectively. The data is output from the selector SL12 series. Thus, one line of data can be output from the serial output port SO12. A similar operation applies to the serial output port SO34.

Figure 8:
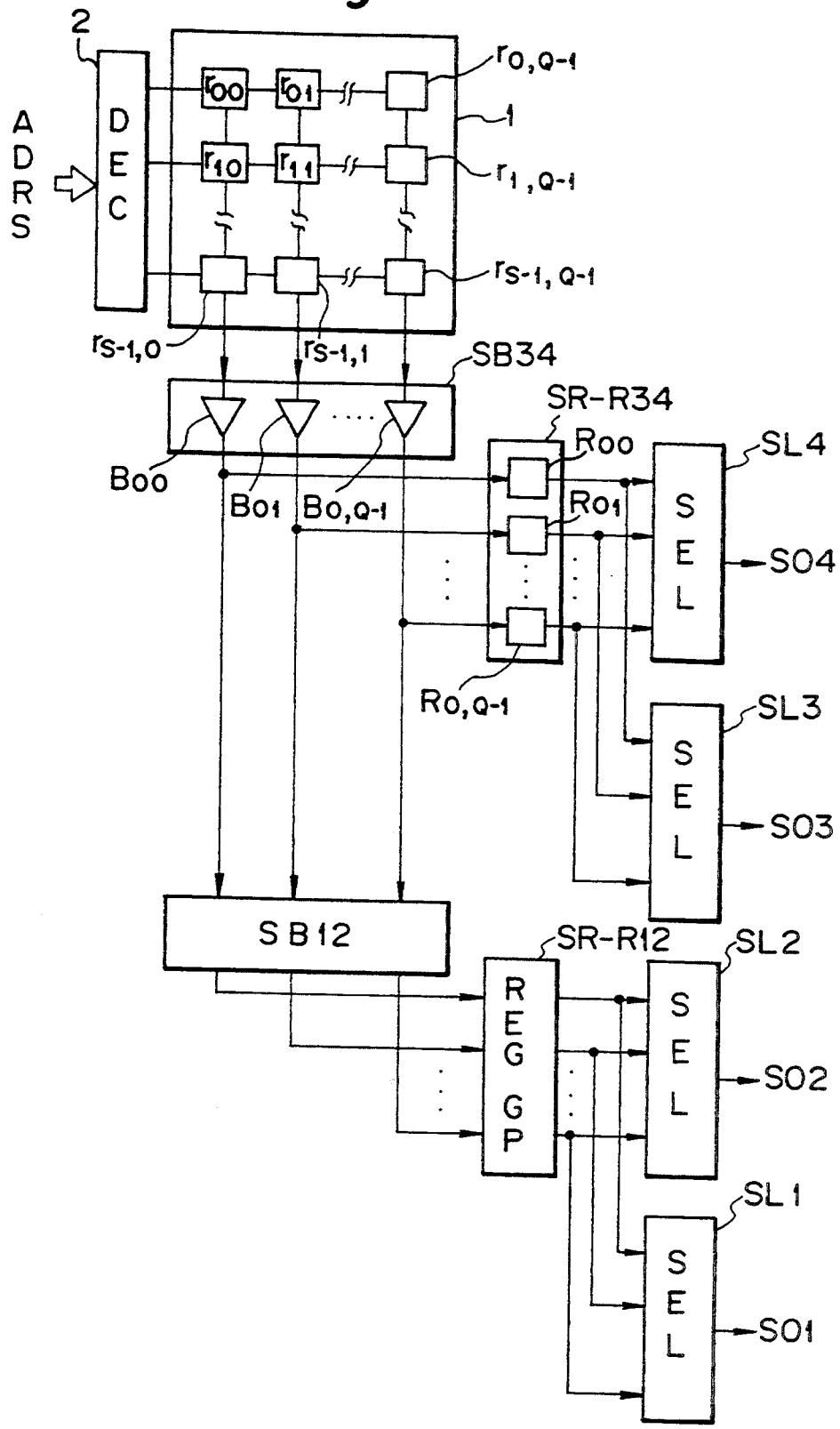
FIG. 8 is a block diagram showing a construction of principal portions in accordance with a third embodiment of the present invention.

FIG. 8 is a schematic diagram showing principal portions in accordance with a third embodiment of the present invention. In this embodiment, buffer groups SB1 and SB2 which drive respective Q data pieces which are read from Q connection lines of a memory 1 are provided. In addition, register groups SR-R12 and SR-R34 for storing respective Q data pieces are provided. The register group SR-R12 is connected to two selectors SL1 and SL2 in parallel. Likewise, the register group SR-R34 is connected to two selectors SL3 and SL4. These selectors have Q inputs and one output. The selectors SL1 to SL4 are provided with serial output ports SO1 to SO4, respectively.

In the third embodiment, two lines of data which are read from the memory 1 in succession are loaded to the respective register group SR-R12 and SR-R34. Halves of Q data pieces stored in the register group SR-R12 can be output in series through the selector SL1 and SL2, respectively. A similar operation applies to the serial output ports SO3 and SO4.

For example, the first half Q/2 data pieces of the register group SR-R12 are output in series from the serial output port SO1 through the selector SL1. The second half Q/2 data pieces of the register group SR-R12 are output in series from the serial output port SO2 through the selector SL2. A similar operation applies to the serial output ports SO3 and SO4.

The third embodiment is used when one line of data of a video signal is constructed of Q/2 pieces. One line of data has been stored in the first half of each row of the memory 1 and another line of data has been stored in the second half thereof. For example, two lines of data loaded in the register group SR-R12 are output in series from the serial output port SO1 and SO2 line by line.

Figure 9:
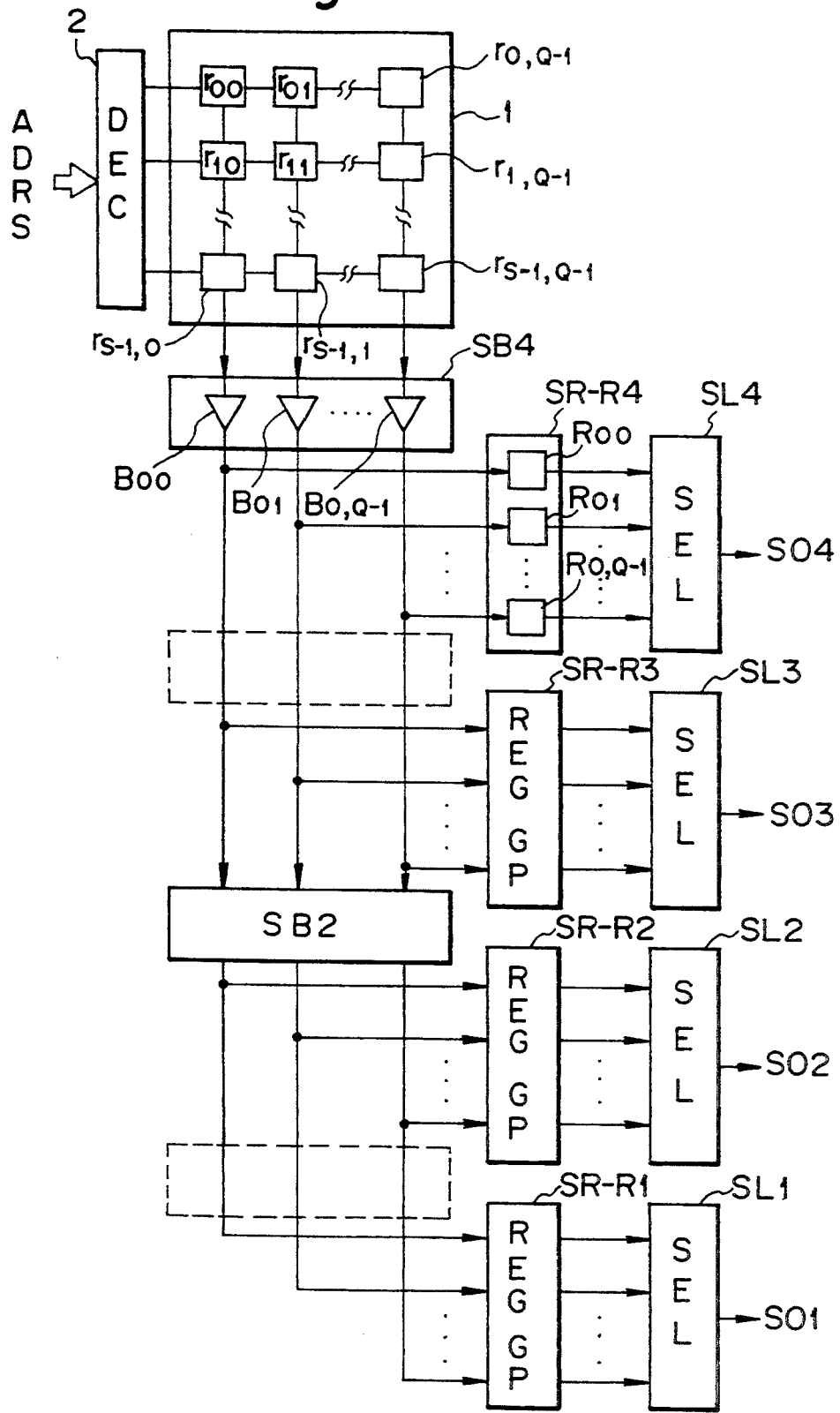
FIG. 9 is a block diagram showing a construction of principal portions in accordance with a fourth embodiment of the present invention.

FIG. 9 is a block diagram showing a construction in accordance with a fourth embodiment of the present invention. In this fourth embodiment, when the drive capacity of each buffer group is large, additional buffer groups can be connected in the positions indicated by the dotted lines.

Figure 10:
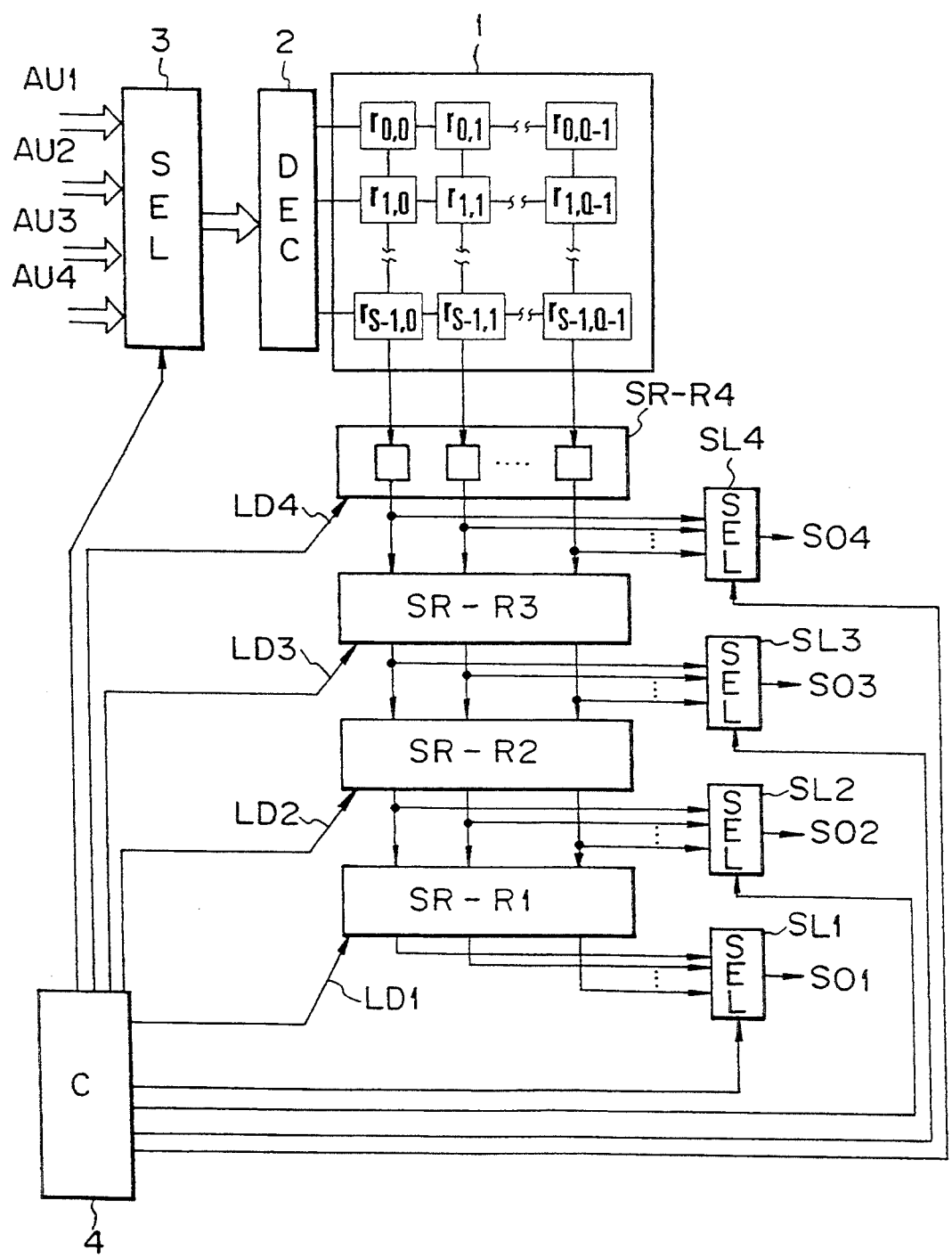
FIG. 10 is a block diagram showing an overall construction in accordance with a fifth embodiment of the present invention.

Then, with reference to FIG. 10, the fifth embodiment in accordance with the present invention is described. Like the above mentioned embodiments, a semiconductor memory 1, an address decoder 2, an address selector 3, and a control circuit 4 are provided. The semiconductor memory 1 comprises Q columns $\times$ S rows of memory elements $r_{ij}$, which can random access 4 rows of data, row by row, at a time.

Figure 11:
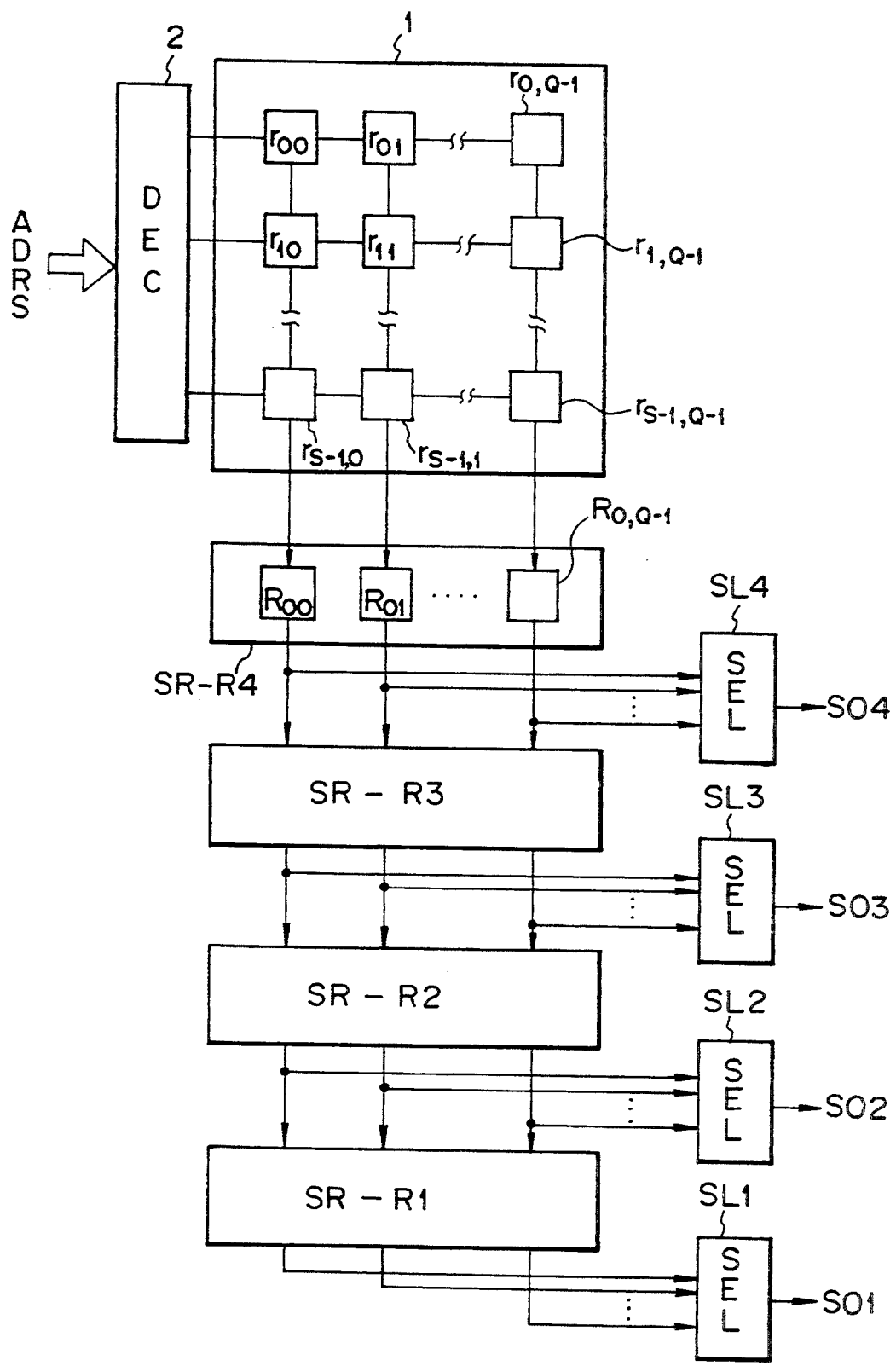
FIG. 11 is a block diagram showing a construction of principal portions in accordance with the fifth embodiment of the present invention.

First to fourth register groups SR-R1 to SR-R4 are connected to Q column connection lines of the memory 1 in series. Thus, the first to fourth register groups SR-R1 to SR-R4 store respective Q data pieces. Respective Q output data pieces of the register groups SR-R1 to SR-R4 are input to respective first to fourth selectors SL1 to SL4. The first to fourth selectors SL1 to SL4 output one piece at a time. In other words, the first to fourth selectors SL1 to SL4 have Q inputs and one output. These selectors SL1 to SL4 are provided with first to fourth serial output ports SO1 to SO4, respectively. The fifth embodiment and subsequent embodiments differ from the above discussed embodiments because the fifth embodiment and subsequent embodiments do not have with buffer groups. As shown in FIG. 11 which illustrates principal portions of FIG. 10, the register group SR-R4 is constructed of Q registers $R_{00}$ to $R_{0, Q-1}$. Likewise, other register groups SR-R3, SR-R2, and SR-R1 are respectively constructed of Q registers.

Under control of the control circuit 4, the following operations are performed in succession.

(1) The high order bit AU1 is selected by the address selector 3 under control of the control circuit 4. This designates, via the address decoder 2, a row for which serial output data is to be stored and output from the serial output port SO1 is designated. When a load signal (LD4) is supplied from the control circuit 4, data designated with the address bit AU1 is loaded from the memory 1 to the register group SR-R4.

(2) The high order bit AU2 is selected by the address selector 3 under control of the control circuit 4. A row for which serial output data is to be stored and output from the serial output port SO2 is designated. When a load signal LD3 is supplied to the register group SR-R3, Q data pieces stored in the register group SR-R4 are loaded to the register group SR-R3. In addition, when the load signal LD4 is supplied to the register group SR-R4, data designated with the address bit AU2 is loaded from the memory 1 to the register group SR-R4.

(3) The high order bit AU3 is selected by the address selector 3 under control of the control circuit 4. A row at which serial output data is stored and output from the serial output port SO3 is designated. When a load signal LD2 is supplied to the register group SR-R2, Q data pieces stored in the register group SR-R3 are loaded to the register group SR-R2. In addition, when the load signal LD3 is supplied to the register group SR-R3, Q data pieces stored in the register group SR-R4 are loaded to the register group SR-R3. Moreover, when the load signal LD4 is supplied to the register group SR-R4, data designated with the address bit AU3 is loaded from the memory 1 to the register group SR-R4.

(4) The high order bit AU4 is selected by the address selector 3 under control of the control circuit 4. A row for which serial output data is to be stored and output from the serial output port SO4 is designated. When a load signal LD1 is supplied to the register group SR-R1, Q data pieces stored in the register group SR-R2 are loaded to the register group SR-R1. In addition, when the load signal LD2 is supplied to the register group SR-R2, Q data pieces stored in the register group SR-R3 are loaded to the register group SR-R2. Moreover, when the load signal LD3 is supplied to the register group SR-R3, Q data pieces stored in the register group SR-R4 are loaded to the register group SR-R3. Furthermore, when the load signal LD4 is supplied to the register group SR-R4, data designated with the address bit AU4 is loaded from the memory 1 to the register group SR-R4.

(5) With the above steps, data is supplied to the serial output ports SO1 from SO4 to the register groups SR-R1 to SR-R4, respectively. Thus, respective data of the register groups SR-R1 to SR-R4 are supplied in series to the serial output ports SO1 to SO4 through the Q-input, one-output selectors SL1 to SL4, respectively. Clocks (not shown in the figure) for the serial outputs are supplied to the respective register groups.

While the steps (1) to (3) are performed, data cannot be output to the serial output ports SO1 to SO4. However, by using a blanking period, data can be output to the serial output ports SO1 to S04. In addition, while data is output in series, in such a case where a two-dimensional filter is operating, a preceding serial data output may be required. In this case, by repeating the steps (4) and (5), a continuous operation can be performed without using such a blanking period.

Figure 12:
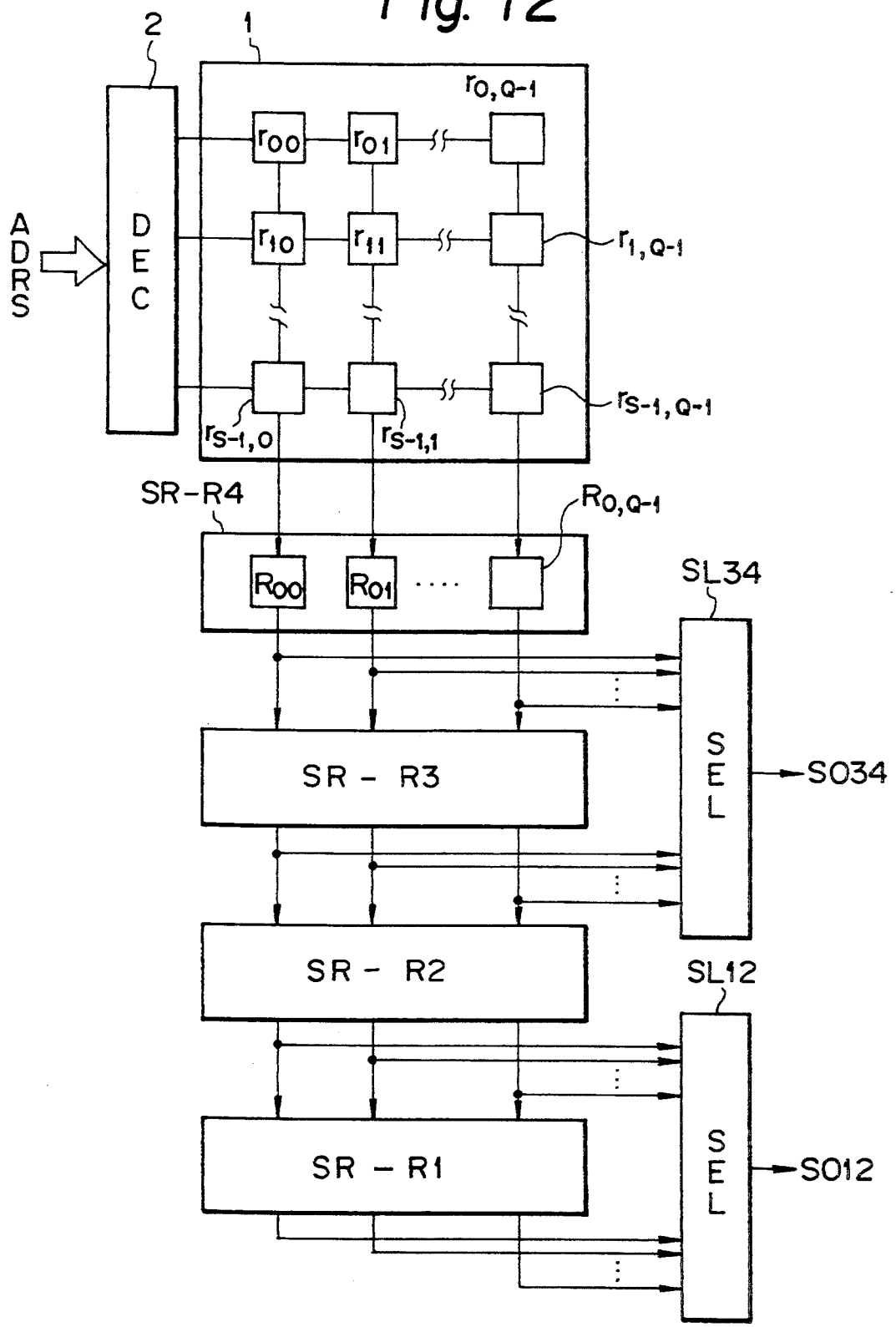
FIG. 12 is a block diagram showing a construction of principal portions in accordance with a sixth embodiment of the present invention.

FIG. 12 is a schematic diagram showing principal portions in accordance with a sixth embodiment of the present invention. Like the above mentioned fifth embodiment, in the sixth embodiment, there are register groups SR-R1 to SR-R4 for storing respective Q data pieces read from Q connection lines of a memory 1. By the register groups SR-R4 and SR-R3, a total of 2 Q output data pieces are supplied to a 2Q-input, one-output selector SL34. Likewise, by the register groups SR-R2 and SR-R1, a total of 2 Q output data pieces are supplied to a 2Q-input, one-output selector SL12. Thus, two serial output ports which are referred to as SO12 and SO34 are provided as shown.

Like the fifth embodiment, in this sixth embodiment, four rows of data successively read from the memory 1 are loaded to the respective register groups SR-R1 to SR-R4. 2Q data pieces stored in the register groups SR-R2 and SR-R1 can be output in series from the serial output port SO12 through the selector SL12. A similar operation applied to the serial output port SO34.

The sixth embodiment is used when one line of data of a video signal is constructed of 2Q data pieces. In this construction, the first half Q data pieces and the second half Q data pieces of 2Q data pieces have been stored to each odd row and each even row of the memory 1, respectively. The first half of the one line data and the second half thereof are loaded to the register group SR-R2 and the register group SR-R1, respectively. The data is output from the serial output port SO12 in series. Thus, one line of data can be output from the serial output port SO12. A similar operation applies to the serial output port SO34.

Figure 13:
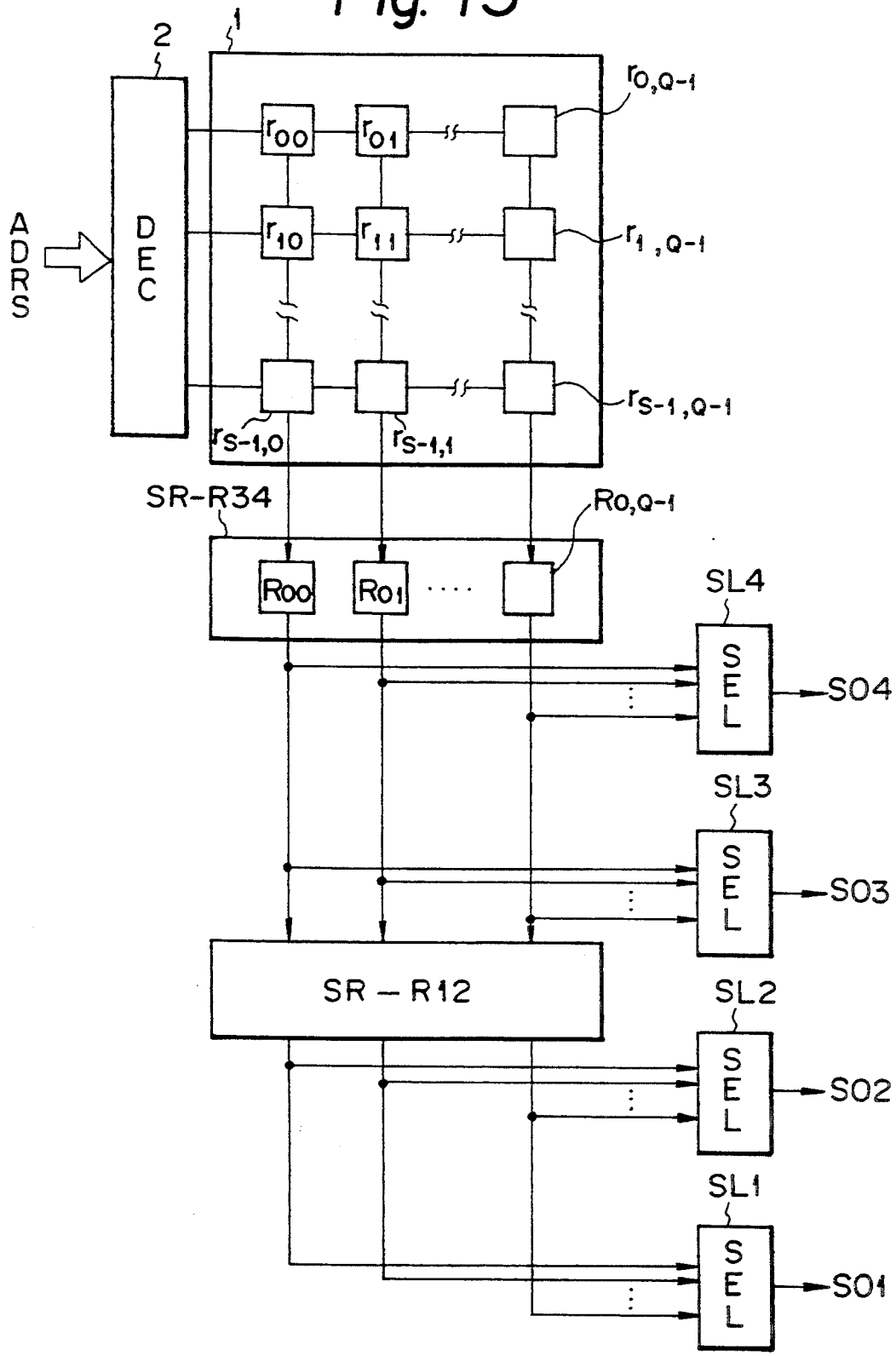
FIG. 13 is a block diagram showing a construction of principle portions in accordance with a seventh embodiment of the present invention.

FIG. 13 is a schematic diagram showing principal portions in accordance with a seventh embodiment of the present invention. In this embodiment, register groups SR-R12 and SR-R34 for storing respective Q data pieces read from Q connection lines of a memory 1 are provided. The register group SR-R12 is connected in parallel to two selectors SL1 and SL2. Likewise, the register group SR-R34 is connected in parallel to two selectors SL3 and SL4. These selectors have respective Q inputs and one output. The selectors SL1 to SL4 are provided with serial output ports SO1 to SO4, respectively.

In the seventh embodiment, two rows of data being successively read from the memory 1 are loaded to the respective register groups SR-R12 and SR-R34. The serial output ports SO1 and SO2 can output in series halves of Q data pieces stored in the register group SR-R12 through the selectors SL1 and SL2, respectively. This operation applies to the serial output ports SO3 and SO4.

For example, the first half Q/2 data pieces stored in the register group SR-R12 is output in series from the serial output port SO1 through the selector SL1; and the second half Q/2 data pieces from the serial output port SO2 through the selector SL2. A similar operation applies to the serial output ports SO3 and SO4.

The seventh embodiment is used when one line of data of a video signal is constructed of Q/2 data pieces. In this construction, one line of data has been stored in the first half of each row of the memory 1 and another line of data has been stored in the second half of each row of the memory 1. For example, two lines of data which are loaded to the register group SR-R12 are output in series from the serial output ports SO1 and SO2 line by line.

In the above mentioned embodiments, the buffer groups and the register groups are disposed downstream of the memory 1. However, the buffer groups and the register groups can be disposed upstream of the memory 1. In the above description, a write operation to the memory 1 is omitted. The write operation can be performed in such a way that write data is supplied in series to a shift register connected to parallel outputs of Q connection lines of the memory 1.

Figure 14:
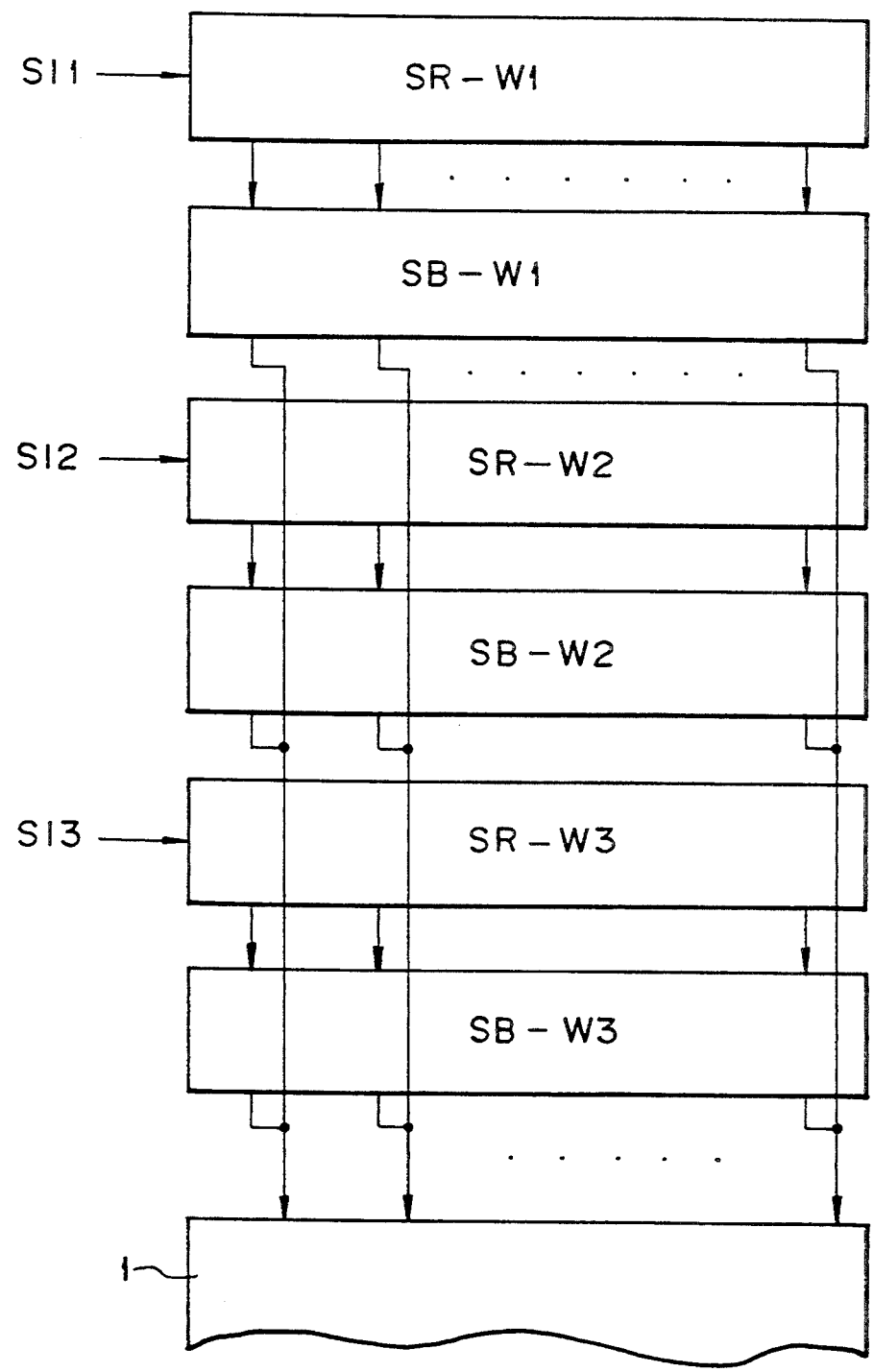
FIG. 14 is a block diagram showing a construction of a write mode in accordance with the present invention.

In addition, data can be written to this memory 1 through multiple ports. As an example, FIG. 14 shows an input portion of a three-input multi-port memory. Write data is input in series from input ports SI1, SI2, and SI3 to first through third shift registers SR-W1, SR-W2, and SR-W3, respectively. Thereafter, only a first tri-state buffer group SB-W1 is operated. Second and third tri-state buffer groups SB-W2 and SB-W3 are not operated. Thus, data which is input from SI1 is supplied to a proper row address of the memory 1. This row is designated from an address input terminal to a decoder (they are not shown in FIG. 14). Likewise, by selectively operating the second and third tri-state buffer groups, respective data from the input ports SI2 and SI3 can be written to the memory 1. The control of the operations of these buffer groups, the control for supplying data from the input ports to the shift register group, the designation of the write state or read state of the memory 1, and so forth are performed by a control circuit (not shown in FIG. 14).

Figure 15:
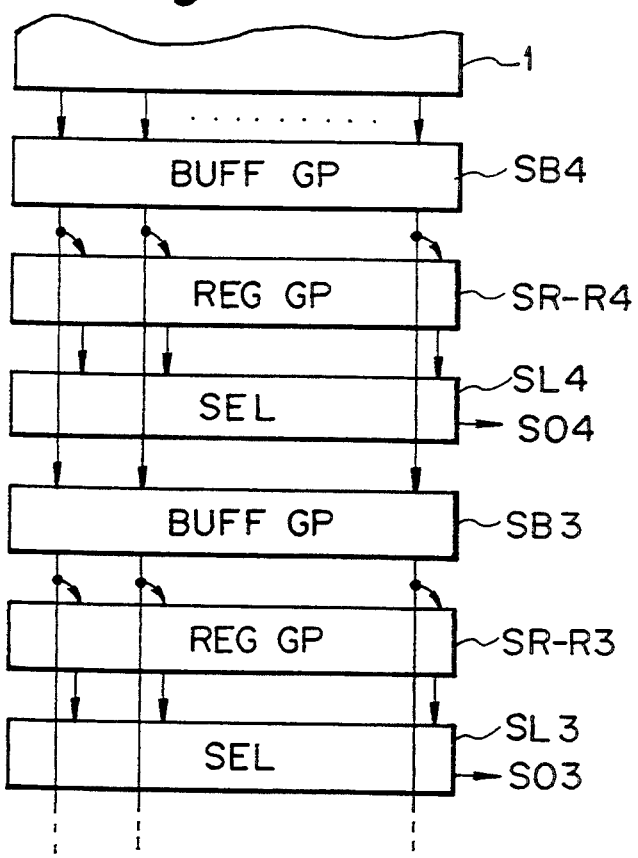
FIG. 15 is a schematic block diagram describing a layout of an integrated circuit in accordance with the present invention.
Figure 16:
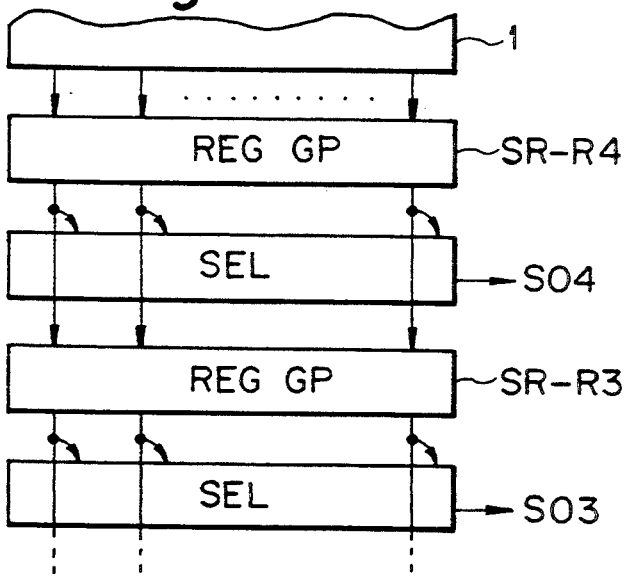
FIG. 16 is a schematic block diagram describing the layout of an integrated circuit in accordance with the present invention.

In the respective constructions shown in FIG. 5 and FIG. 10, by using layouts shown in FIG. 15 and FIG. 16, the wiring areas can be reduced and thereby increasing integration of circuitry.

Figure 17:
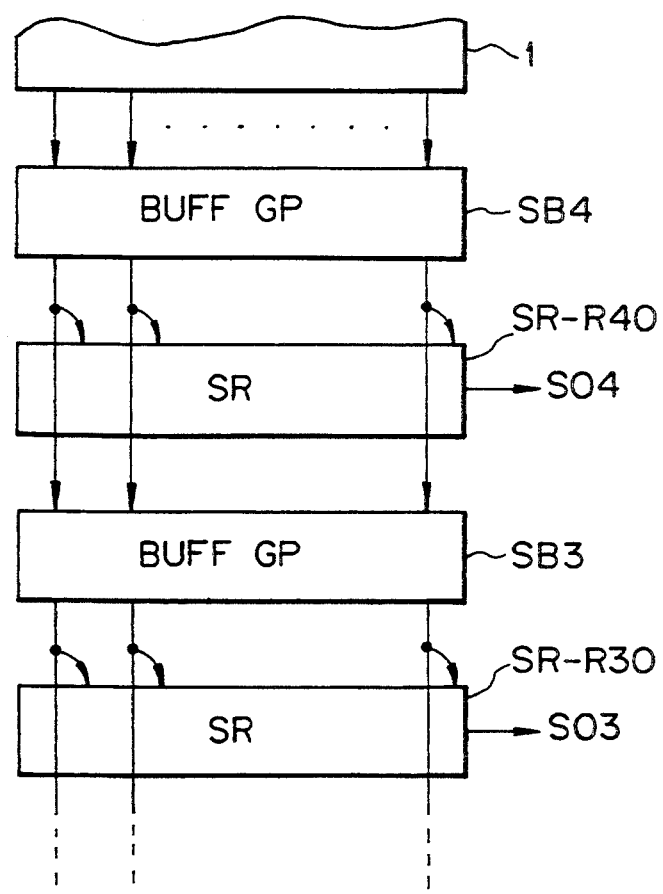
FIG. 17 is a block diagram showing an outlined construction using a shift register in accordance with an eighth embodiment of the present invention.
Figure 18:
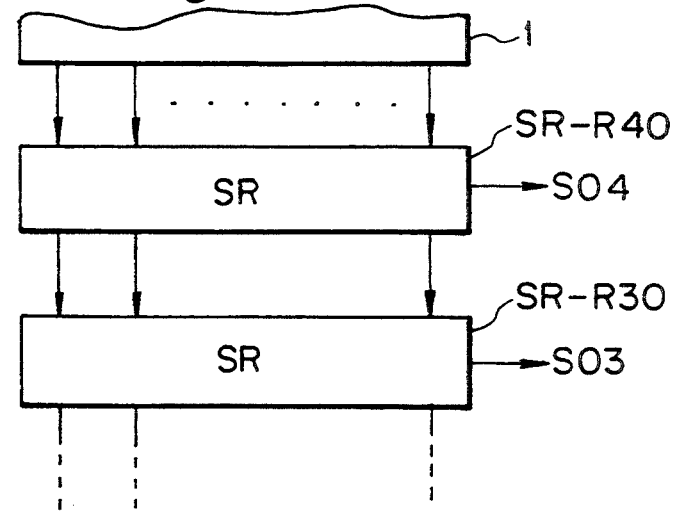
FIG. 18 is a block diagram showing an outlined construction using a shift register in accordance with a ninth embodiment of the present invention.

In the above mentioned embodiments, data stored in the register groups is successively selected by selectors so as to obtain serial outputs. However, the functions of the register groups and the selectors can be substituted with shift registers. FIG. 17 is a schematic diagram showing a partial construction where the register groups SR-R3 and SR-R4 and the selectors SL3 and SL4 shown in FIG. 5 are substituted with shift registers SR-R30 and to SR-R40. In addition, FIG. 18 is a schematic diagram showing a partial construction where the register groups SR-R3 and SR-R4 and the selectors SL3 and SL4 shown in FIG. 6 are substituted with shift registers SR-R30 and SR-R40.

Respective Q data pieces are loaded to the shift registers SR-R30 and SR-R40 through the buffer groups SB3 and to SB4, respectively. Alternatively, respective Q data pieces being read from the memory 1 are loaded to the shift registers SR-R30 and SR-R40 as parallel inputs. The loaded contents are obtained from the serial output ports SO3 and SO4 as serial outputs. The constructions of FIG. 5 and FIG. 10 are functionally the same as those of FIG. 17 and FIG. 18, respectively. However, the hardware scale of the constructions using shift registers is smaller than other constructions.

According to the present invention, in a small circuit construction, a multi-port memory can be accomplished without increasing a load driven by memory 1.

Having described specific preferred embodiments of the present invention with reference to the accompanying drawings, it is to be understood that the invention is not limited to those precise embodiments, and that various changes and modifications may be effected therein by one skilled in the art without departing from the scope or the spirit of the invention as defined in the appended claims.

What is claimed is:

1. A multi-port memory, comprising:
   P stages of buffer groups, connected in series to Q connection lines of rows or columns of a semiconductor memory, for driving Q data pieces received from the semiconductor memory, where P and Q are integers greater than 1;
   P register groups for receiving the Q data pieces from Q outputs of each buffer group and for storing said Q data pieces;
   T (where T is an integer larger than 1) selector means, each selector means separately receiving at parallel inputs nQ data pieces which are output from nQ (where n is an integer larger than or equal to 1) registers of said P register groups, selecting data pieces from among the nQ data pieces and separately outputting the selected data pieces at a serial output port located at a respective output terminal; and
   control means connected to the semiconductor memory, the buffer groups, the register groups, and the selector means for selectively designating respective address bits of said rows or columns, for controlling the buffer groups and the register groups to load said register groups, and for controlling the selection by said selector means.

2. A multi-port memory, comprising:
   P stages of buffer groups, connected in series to Q connection lines of rows or columns of a semiconductor memory, for driving Q data pieces received from the semiconductor memory, where p and Q are positive integers greater than 1;
   P shift registers, each shift register receiving Q data pieces from Q outputs of a buffer group, storing said Q data pieces, and having a serial output port located at a respective output terminal; and
   control means connected to the semiconductor memory, the buffer groups and the shift registers for selectively designating respective address bits of said rows or columns, for causing the buffer groups and the shift registers to load said shift registers, and for shifting said Q data pieces stored in said shift registers.

3. A multi-port memory, comprising:
   P stages of register groups, connected in series to Q connection lines of rows or columns of a semiconductor memory, for storing Q data pieces, where P and Q are integers greater than 1;
   T (where T is an integer larger than 1) selector means, each selector means receiving by separate parallel inputs nQ data pieces which are output from nQ (where n is an integer larger than or equal to 1) registers of said P register groups, selecting data pieces from among the nQ data pieces, and outputting the selected data pieces at a serial output port located at a respective output terminal; and
   control means connected to the semiconductor memory, the register groups and the selector means for selectively designating respective address bits of said rows or columns, for loading said register groups, and for controlling selecting by said selector means.

4. A multi-port memory, comprising:
   P shift registers, connected in series to Q connection lines of rows or columns of a semiconductor memory, for receiving Q outputs of said connection lines in parallel and for storing Q data pieces, P and Q being integers greater than 1, each shift register having a serial output port located at a respective output terminal; and control means connected to the semiconductor memory and the shift registers for selectively designating respective address bits, for loading said shift registers, and for shifting said Q data pieces stored in said shift registers.

5. A multi-port memory, comprising:

P stages of buffer groups, connected in series to Q connection lines of columns of a semiconductor memory, for driving Q data pieces received from the semiconductor memory, where P and Q are integers greater than one;

P register groups for receiving Q data pieces from Q outputs of the P buffer groups, respectively, and for storing the Q data pieces;

T selector means for receiving data pieces in parallel from the P register groups, storing the received data pieces, and outputting the data pieces in series from T serial output ports located at respective output terminals of the T selector means, where T is an integer greater than one; and control means connected to the semiconductor memory, the buffer groups, the register groups, and the selector means for controlling a flow of data pieces through the Q connection lines, controlling a flow of data through the P register groups, and controlling the output of data from the T serial output ports.

6. A multi-port memory, comprising:

P stages of buffer groups, connected in series to Q connection lines of columns of a semiconductor memory, for driving Q data pieces received from the semiconductor memory, where P and Q are integers greater than one;

P shift registers for receiving Q data pieces from Q outputs of the P buffer groups respectively and for storing said Q data pieces, each shift register having a serial output port located at a respective output terminal; and control means connected to the semiconductor memory, the buffer groups, and the shift registers for selectively designating respective address bits, for loading the shift registers, and for shifting said Q data pieces stored in the shift registers.

7. A multi-port memory, comprising:

P stages of register groups, connected in series to Q connection lines of columns of a semiconductor memory, for storing Q data pieces, where P and Q are integers greater than one;

T selector means for receiving data pieces in parallel from the P register groups, storing the received data pieces, and outputting the data pieces in series from T serial output ports located at respective output terminals of the T selector means, where T is an integer greater than one; and control means connected to the semiconductor memory, the register groups, and the selector means for controlling a flow of data pieces through the Q connection lines, controlling a flow of data through the P register groups, and controlling the output of data from the T serial output ports.

8. A multi-port memory, comprising:

P shift registers, connected in series to Q connection lines of columns of a semiconductor memory, for receiving Q outputs of said connection lines in parallel and for storing Q data pieces, where P and Q are integers greater than one, each shift register having a serial output port located at a respective output terminal; and control means connected to the semiconductor memory and the shift registers for controlling a flow of data pieces through the Q connection lines and the P shift registers.

9. A multi-port memory, comprising:

P shift registers for serially receiving Q data pieces and for storing said Q data pieces;

P stages of buffer groups connected in parallel to Q connection lines of columns of a semiconductor memory for receiving Q data pieces in parallel from Q outputs of the P shift registers, respectively, storing said Q data pieces, and writing Q data pieces into separate rows or columns of the semiconductor memory, where p and Q are integers greater than one; and control means connected to the semiconductor memory, the buffer groups, and the shift registers for selectively designating respective address bits, for loading the shift registers, shifting said Q data pieces stored in the shift registers, and controlling the buffer groups.

* * * * *